United States Patent
Gilman et al.

(10) Patent No.: US 10,324,140 B2
(45) Date of Patent: Jun. 18, 2019

(54) ZERO SEQUENCE SENSING APPARATUS AND METHOD

(71) Applicant: Littelfuse, Inc., Chicago, IL (US)

(72) Inventors: Daniel R. Gilman, Hinsdale, IL (US); Kip M. Larson, Rapid City, SD (US); Brian Johnson, Saltash (GB)

(73) Assignee: Littelfuse, Inc., Chicago, IL (US)

( * ) Notice: Subject to any disclaimer, the term of this patent is extended or adjusted under 35 U.S.C. 154(b) by 32 days.

(21) Appl. No.: 15/256,800

(22) Filed: Sep. 6, 2016

(65) Prior Publication Data

US 2018/0067172 A1    Mar. 8, 2018

(51) Int. Cl.
| | |
|---|---|
| *G01R 31/42* | (2006.01) |
| *G01R 15/20* | (2006.01) |
| *G01R 19/00* | (2006.01) |
| *G01R 31/02* | (2006.01) |
| *H02H 3/16* | (2006.01) |
| *G01R 19/10* | (2006.01) |

(52) U.S. Cl.
CPC .......... *G01R 31/42* (2013.01); *G01R 15/205* (2013.01); *G01R 19/0092* (2013.01); *G01R 31/025* (2013.01); *H02H 3/162* (2013.01); *G01R 19/10* (2013.01)

(58) Field of Classification Search
CPC .......... G01R 31/2894; G01R 31/2853; G11C 29/022; G11C 29/816

USPC ................... 324/71.11, 73.1, 76.11
See application file for complete search history.

(56) References Cited

U.S. PATENT DOCUMENTS

| | | | |
|---|---|---|---|
| 5,945,636 A | 8/1999 | Sakich et al. | |
| 6,295,190 B1 | 9/2001 | Rinaldi et al. | |
| 6,429,661 B1 | 8/2002 | Schweitzer, Jr. | |
| 6,617,972 B2* | 9/2003 | Takarada ........... | G08B 21/0484 324/538 |
| 8,779,729 B2* | 7/2014 | Shiraishi ............ | G06F 1/3212 320/155 |
| 2009/0251308 A1* | 10/2009 | Schweitzer, III .... | G01R 31/025 340/539.1 |
| 2012/0098518 A1* | 4/2012 | Unagami ............. | G01R 22/066 324/74 |
| 2012/0119751 A1* | 5/2012 | Scott .................... | H02H 1/0015 324/509 |

OTHER PUBLICATIONS

International Search Report and Written Opinion dated Nov. 6, 2017 in corresponding PCT/US2017/050033.

* cited by examiner

*Primary Examiner* — Giovanni Astacio-Oquendo

(57) ABSTRACT

Zero sequence current sensors for single-phase and multiphase power systems are disclosed. In one implementation, a zero sequence current sensor is positioned between conductors associated with a single-phase power system or a multiphase power system. The current sensor may be shaped to accommodate maintaining a substantially equal distance between the conductors associated with the single-phase power system or the multiphase power system.

14 Claims, 4 Drawing Sheets

ZERO SEQUENCE SENSING APPARATUS AND METHOD

BACKGROUND

Field

The present disclosure relates generally to zero sequence ground current sensing apparatuses and methods. More specifically, the present disclosure relates to apparatuses and methods for ascertaining phase faults associated with the multiphase power systems.

Description of Related Art

Current transformers (CTs) are known apparatuses for detecting phase line or conductor failures. Specifically, a common CT is a toroidal magnetic core that includes a window that encloses one or more phase lines or conductors. The magnetic core is wrapped with multiple turns of a second conductor, known as the "secondary", that when properly terminated will produce a current proportional to the flux experienced by the magnetic core. Another name for a CT intended to measure the resulting summation of multiple different phase conductors is a zero sequence CT.

Under normal load conditions, a vector sum of the phase currents associated with the phase lines or conductors passing through the CT's window will be zero or close to zero. When the vector sum of the phase currents is zero or close to zero, flux is not introduced in the core of the CT. However, if one or more of the phase lines or conductors passing through the CT allows current to pass in a conduction path outside of the CT, the vector sum of the phase currents associated the phase lines or conductors passing through the CT's window will no longer be zero. When the vector sum of the phase currents is no longer zero, a flux is introduced in the core of the CT. The flux will induce a current in the CT's secondary. The current of sufficient magnitude may be communicated to an auxiliary relay. The auxiliary relay may be coupled to a circuit breaker, alarm, or other circuit disrupting device. The circuit-disrupting device may be arranged to terminate voltage flowing on the phase lines or conductors passing through the CT.

Known CTs have various drawbacks. First, known CTs are difficult to install. For example, most high accuracy CTs make use of a contiguous magnetic core window. Therefore, installation of known CTs necessitates having to feed the phase line conductors through the contiguous window. This makes it difficult to install known CTs on already deployed phase line conductors. Second, known CTs are quite large in size. Therefore, the size of known CTs may restrict their deployment locations, or add cost to provide space for their installation. Finally, for proper operation phase line conductors must be properly positioned and centered within the window of known CTs. Therefore, it is often necessary to mount known CTs and phase line conductors to rigid support structures on either or both sides of the known CT. Use of such rigid support structures may increase the deployment costs associated with the use of CTs. Finally, known CTs require that all conductors must pass thru them perpendicular to the core window, and that no bends of conductors are allowed within a specified distance of the core to maintain accuracy.

Other problems with known CTs will become apparent in view of the disclosure below.

SUMMARY

This Summary is provided to introduce a selection of concepts in a simplified form further described below in the Detailed Description. This Summary is not intended to identify key or essential features of the claimed subject matter, nor is this Summary intended as an aid in determining the scope of the claimed subject matter.

Zero sequence current sensors for single-phase and multiphase power systems are disclosed. In one implementation, a zero sequence current sensor is positioned between conductors associated with a single-phase power system or a multiphase power system. The current sensor may have a shape to accommodate maintaining a substantially equal distance between the conductors associated with the single-phase power system or the multiphase power system.

In a particular implementation, a current sensor may be positioned between conductors of a single-phase power system or a multiphase power system. The current sensor may be a magnetic field sensor, a magnetoresistive (MR) sensor, a tunneling magnetoresistance (TMR) sensor, or a paired magnetoresistive (PMR) sensor. The current sensor may have a shape to accommodate maintaining a substantially equal spacing between the conductors of the single-phase power system or the multiphase power system. The current sensor may be at least partially disposed within a sheath. The sheath may provide the shape to accommodate maintaining the substantially equal spacing between the conductors of the single-phase power system or the multiphase power system.

In another implementation, a method is provided in which a current sensor is positioned between conductors of a single-phase power system or a multiphase power system. The method may further include coupling the current sensor to a circuit breaker associated with the single-phase power system or the multiphase power system. The current sensor may be a magnetic field sensor, an MR sensor, a TMR sensor, or a PMR sensor. The method may further comprise inserting the current sensor at least partially within a sheath. The sheath may provide a shape to accommodate maintaining a substantially equal spacing between the conductors of the single-phase power system or the multiphase power system.

DETAILED DESCRIPTION

Figure 1:
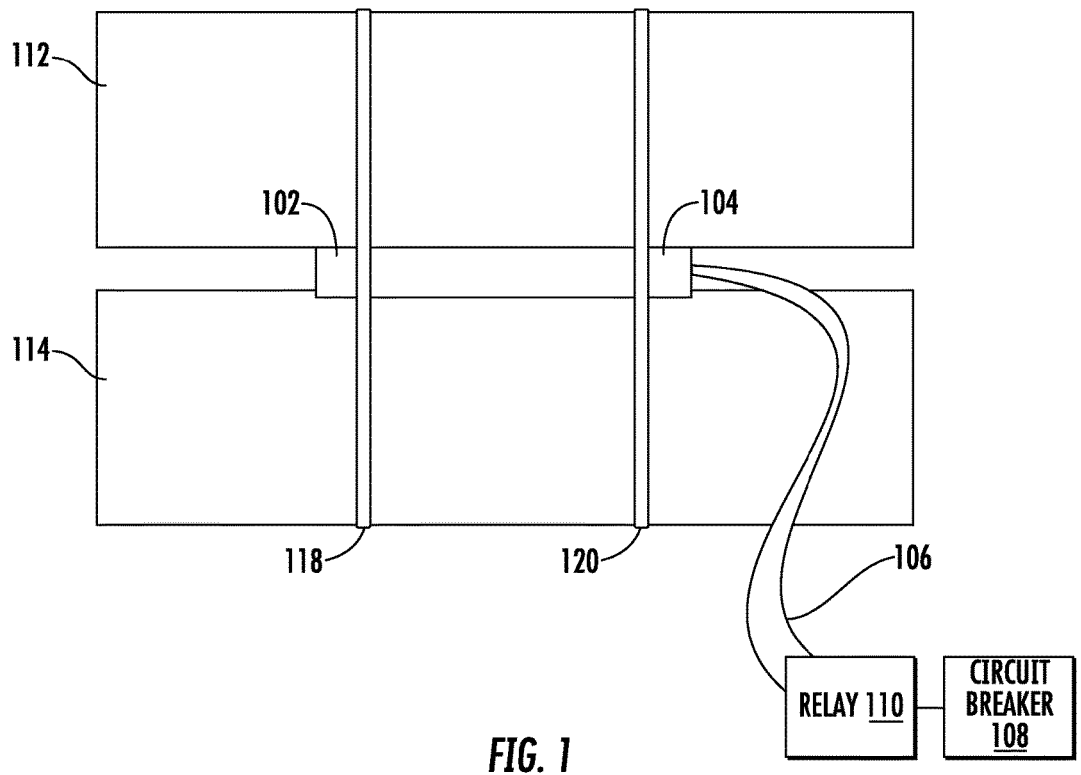
FIG. 1 is a schematic view illustrating an embodiment of a current sensor according to the present disclosure.

FIG. 1 illustrates a current sensor 102 in accordance with the present disclosure. In various implementations, the current sensor 102 may be a magnetic field sensor, a magnetoresistive (MR) sensor, a tunneling magnetoresistance (TMR) sensor, or a paired magnetoresistive (PMR) sensor. In one particular example, the current sensor 102 is a zero sequence sensor.

The current sensor 102 may include an output 104. Leads 106 may be coupled to the output 104 and may connect the output 104 to a circuit breaker 108. In one example, the leads 106 may be coupled to the circuit breaker 108 via a relay 110.

The current sensor 102 may be positioned between a plurality of conductors 112 and 114 of a single-phase power system. In another implementation, the current sensor 102 may be positioned between the plurality of conductors 112, 114 and 116 (see FIG. 2) of a multiphase power system.

The current sensor 102 is functional to detect a power system fault associated with the single-phase power system or the multiphase power system. Therefore, the current sensor 102 is functional to detect the presence of arcing or other resistive faults between one or more of the conductors 112, 114 and 116 and ground. In other words, the current sensor 102 is functional to detect the presence of low-level currents caused by current leakage from one or more of the conductors 112, 114 and 116 to ground.

The plurality of conductors 112 and 114, or the plurality of conductors 112, 114 and 116, may be bundled close to the current sensor 102 by one or more fasteners 118 and 120. The one or more fasteners 118 and 120 may be cable ties, tape, zip ties, or the like.

In one implementation, the current sensor 102 is shaped so that the plurality of conductors 112 and 114, or the plurality of conductors 112, 114 and 116, are substantially equally spaced from each other. In other words, the current sensor 102 may be shaped so that the plurality of conductors 112 and 114, or the plurality of conductors 112, 114 and 116, are essentially or substantially equidistant from each other when the current sensor 102 is positioned between the plurality of conductors 112 and 114, or the plurality of conductors 112, 114 and 116.

The number of conductors discussed in the foregoing is merely exemplary. For example, the current sensor 102 may be implemented in power systems that have a greater number of conductors than discussed in the foregoing. In particular, a three-phase power system may comprise six phase conductors, where each of the three phases is carried on two parallel conductors. The current sensor 102 may be shaped accordingly to accommodate the six phase conductors. More particularly, the current sensor 100 to may be shaped so that the six phase conductors are substantially equally spaced from each other.

Figure 2:
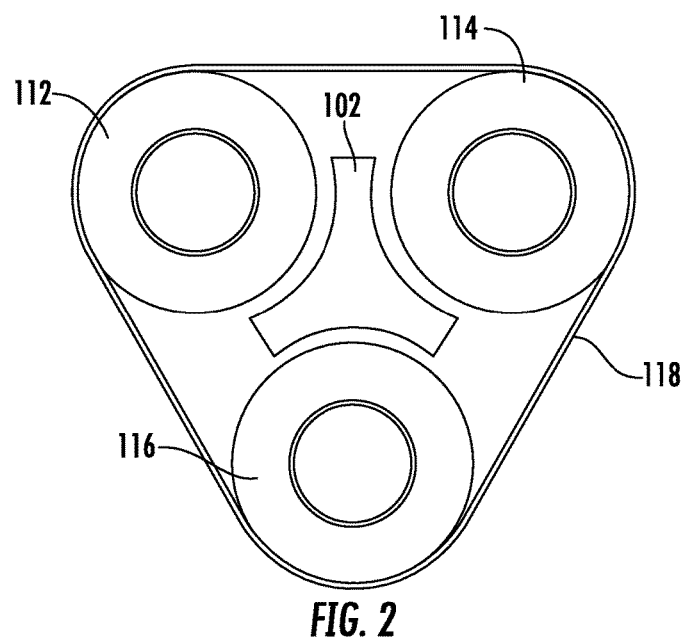
FIG. 2 is a schematic view illustrating another embodiment of a current sensor according to the present disclosure.

FIG. 2 illustrates the current sensor 102 implemented in a multiphase power system. FIG. 2 is illustrated in cross-section. In this example, the current sensor 102 is implemented in a three-phase power system. The three-phase power system includes the plurality of conductors 112, 114 and 116. The plurality of conductors 112, 114 and 116 may be bundled close to or in contact with the current sensor 102 by one or more fasteners 118 and 120 (see FIG. 1).

As illustrated, the current sensor 102 is shaped so that the plurality of conductors 112, 114 and 116 are substantially equally spaced from each other. In other words, the current sensor 102 may be shaped so that the of plurality conductors 112, 114 and 116 are essentially or substantially equidistant from each other when the current sensor 102 is positioned between the plurality of conductors 112, 114 and 116. The plurality of conductors 112, 114 and 116 may be in direct contact with the current sensor 102.

Figure 3:
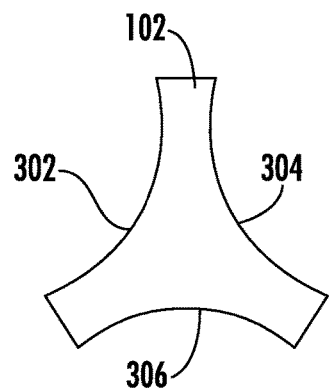
FIG. 3 is a schematic view illustrating another embodiment of a current sensor according to the present disclosure.

FIG. 3 illustrates the current sensor 102 in cross-section. The current sensor 102 may include a first concave surface 302, a second concave surface 304, and a third concave surface 306. Each of the first, second, and third concave surfaces 302, 304 and 306 is configured to accommodate or receive a conductor associated with a three-phase power system.

Figure 4:
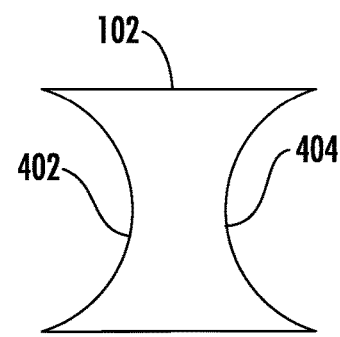
FIG. 4 is a schematic view illustrating another embodiment of a current sensor according to the present disclosure.

FIG. 4 illustrates the current sensor 102 in cross-section. The current sensor 102 may include a first concave surface 402 and a second concave surface 404. Each of the first and second concave surfaces 402 and 404 is configured to accommodate or receive a conductor associated with a single-phase power system.

The shapes of the current sensor 102 illustrated in FIGS. 1-4 are merely exemplary. Specifically, as discussed in the foregoing, the current sensor 102 may be shaped to accommodate any number of conductors.

The current sensor 102 may be manufactured to have a particular shape, as illustrated in FIGS. 1-4, to accommodate a particular number of conductors associated with a power system. In another implementation, the current sensor 102 may be inserted into a sheath that is shaped to accommodate a particular number of conductors associated with a power system. The sheath may be made of a dielectric material.

Figure 5:
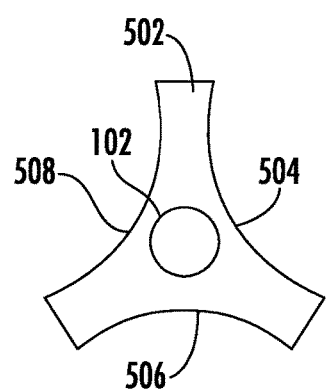
FIG. 5 is a schematic view illustrating an embodiment of a current sensor inserted within a sheath according to the present disclosure.

FIG. 5 illustrates the current sensor 102 in cross-section, inserted at least partially within a sheath 502 that is also shown in cross-section. The sheath 502 may include a first concave surface 504, a second concave surface 506, and a third concave surface 508. Each of the first, second, and third concave surfaces 504, 506 and 508 is configured to accommodate or receive a conductor associated with a three-phase power system.

Figure 6:
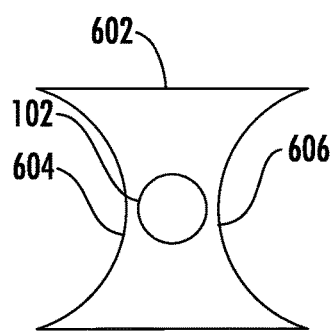
FIG. 6 is a schematic view illustrating another embodiment of a current sensor inserted within a sheath according to the present disclosure.

FIG. 6 illustrates the current sensor 102 in cross-section, inserted at least partially within a sheath 602 that is also shown in cross-section. The sheath 602 may include a first concave surface 604 and a second concave surface 606. Each of the first and second concave surfaces 604 and 606 is configured to accommodate or receive a conductor associated with a single-phase power system.

The respective shapes of the sheaths 502 and 602 illustrated in FIGS. 5 and 6 are merely exemplary. Specifically, the sheathes 502 and 602 may be shaped to accommodate any number of conductors.

Figure 7:
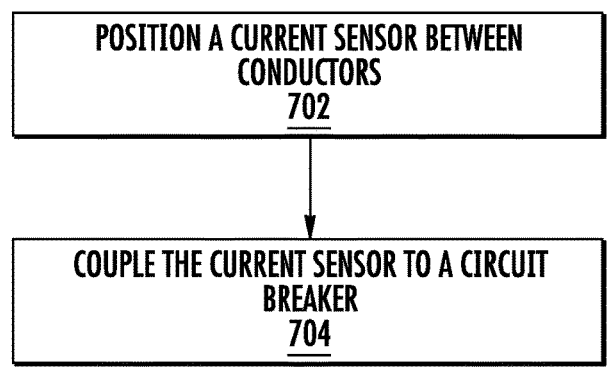
FIG. 7 is a flow diagram illustrating a method according to the present disclosure.

FIG. 7 illustrates an exemplary set of operations 700 associated with the use of a current sensor, such as the current sensor 102 illustrated in FIGS. 1-6. The current sensor 102 may be a magnetic field sensor, MR sensor, TMR sensor, or PMR sensor. At block 702, the current sensor is positioned between conductors of a single-phase power system or a multiphase power system. For example, the current sensor may be positioned between a neutral conductor and a phase conductor of a single-phase system. Alternatively, the current sensor may be positioned between first, second and third conductors of the three-phase system. Generally, the current sensor may have a shape to accommodate maintaining a substantially equal spacing between the conductors of the single-phase power system or the multiphase power system.

At block 704, the current sensor is coupled directly to a circuit breaker, or via a relay associated with the single-phase power system or the multiphase power system.

In an alternative embodiment, the current sensor may be inserted at least partially within a sheath. Inserting the current sensor at least partially within the sheath may occur prior to positioning the current sensor between conductors of the single-phase power system or the multiphase power system.

While current sensors and associated methods are described herein, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

We claim:

1. An apparatus, comprising:
a current sensor positioned between conductors of a single-phase power system or a multi-phase power system, the current sensor to detect a power system fault associated with the single-phase or multiphase power system; and
an output associated with the current sensor.

2. The apparatus according to claim 1, wherein the current sensor is positioned between conductors of the single-phase system, the conductors including a first conductor and a second conductor, and wherein the first conductor is a neutral conductor and the second conductor is a phase conductor.

3. The apparatus according to claim 1, wherein the current sensor is positioned between conductors of the three-phase system, the conductors including first, second and third conductors, each of the first, second and third conductors associated with a unique phase of the three-phase system.

4. The apparatus according to claim 1, wherein the current sensor is a magnetic field sensor, magnetoresistive (MR) sensor, tunneling magnetoresistance (TMR) sensor, or a paired magnetoresistive (PMR) sensor.

5. The apparatus according to claim 1, wherein the current sensor has a shape to accommodate maintaining a substantially equal spacing between the conductors of the single-phase power system or the multi-phase power system.

6. The apparatus according to claim 5, further comprising a sheath, the current sensor at least partially disposed within the sheath, the sheath providing the shape to accommodate maintaining the substantially equal spacing between the conductors of the single-phase power system or the multi-phase power system.

7. The apparatus according to claim 1, further comprising a sheath, the current sensor at least partially disposed within the sheath, the sheath providing a shape to accommodate maintaining a substantially equal spacing between the conductors of the single-phase power system or the multiphase power system.

8. The apparatus according to claim 1, wherein the sheath is made from a dielectric material.

9. An apparatus, comprising:
a current sensor positioned between conductors of a three-phase power system, the current sensor to detect a power system fault associated with the three-phase power system; and
an output associated with the current sensor.

10. The apparatus according to claim 9, further comprising a sheath, the current sensor at least a partially disposed within the sheath.

11. The apparatus according to claim 10, wherein the sheath has a shape to accommodate maintaining substantially equal spacing between conductors of the three-phase power system.

12. The apparatus according to claim 9, wherein the current sensor has a shape to accommodate maintaining substantially equal spacing between conductors of the three-phase power system.

13. The apparatus according to claim 9, the current sensor is a magnetic field sensor, magnetoresistive (MR) sensor, tunneling magnetoresistance (TMR) sensor, or a paired magnetoresistive (PMR) sensor.

14. The apparatus according to claim 9, wherein the current sensor is a zero sequence current sensor.

* * * * *